Dec. 22, 1959 A. KRAUSZ 2,918,620

MAGNETIC AMPLIFIER CIRCUITS

Filed June 18, 1954 2 Sheets-Sheet 1

INVENTOR.
ALFRED KRAUSZ
BY William R. Lane
ATTORNEY

Dec. 22, 1959 A. KRAUSZ 2,918,620

MAGNETIC AMPLIFIER CIRCUITS

Filed June 18, 1954 2 Sheets-Sheet 2

INVENTOR.
ALFRED KRAUSZ
BY William R. Lane
ATTORNEY 2,918,620
Patented Dec. 22, 1959

2,918,620

MAGNETIC AMPLIFIER CIRCUITS

Alfred Krausz, Whittier, Calif., assignor to North American Aviation, Inc.

Application June 18, 1954, Serial No. 437,780

2 Claims. (Cl. 323—89)

This invention relates to an amplifier circuit, and more particularly to a magnetic amplifier circuit which employs an electronic switching network.

Magnetic amplifiers are considerably more efficient than electron tube amplifiers. Saturable reactors and diode rectifiers, which are the component parts of magnetic amplifiers, have a long life, require little maintenance, and are more efficient than their counterparts in other amplifiers. Because of their reliability and ruggedness, magnetic amplifiers find ready use in various types of circuits which provide control or response in accordance with signal devices.

Magnetic amplifier types have been devised which provide A.-C. or D.-C. outputs. The A.-C. output magnetic amplifiers generally have less drift than D.-C. amplifiers because of lower rectifier voltages. The drift of the D.-C. amplifier is accentuated in the case of high gain amplifiers wherein positive feedback is used to increase the gain.

This invention uses a minimum of equipment to detect and amplify a varying D.-C. signal. One feature of this circuit is carrier switched rectifiers and better balance in the output is achieved with poor rectifiers. The circuit also minimizes the effect of change in rectifier characteristics due to temperature or voltage changes, and consequently there is less drift. If sufficient positive feedback is provided, the magnetic amplifier becomes a trigger circuit which provides an output to operate a relay when the input signal reaches a predetermined level.

It is therefore an object of this invention to provide a magnetic amplifier circuit capable of receiving and amplifying low level D.-C. signals.

It is another object of this invention to provide a high gain magnetic amplifier circuit having a minimum of drift.

Another object of this invention is to provide a magnetic amplifier trigger circuit.

A further object of this invention is to provide a magnetic amplifier utilizing carrier switching.

Still another object of this invention is to provide a magnetic amplifying circuit having a balanced output.

Other objects of invention will become apparent from the following description taken in connection with the accompanying drawings, in which—

Figure 1:
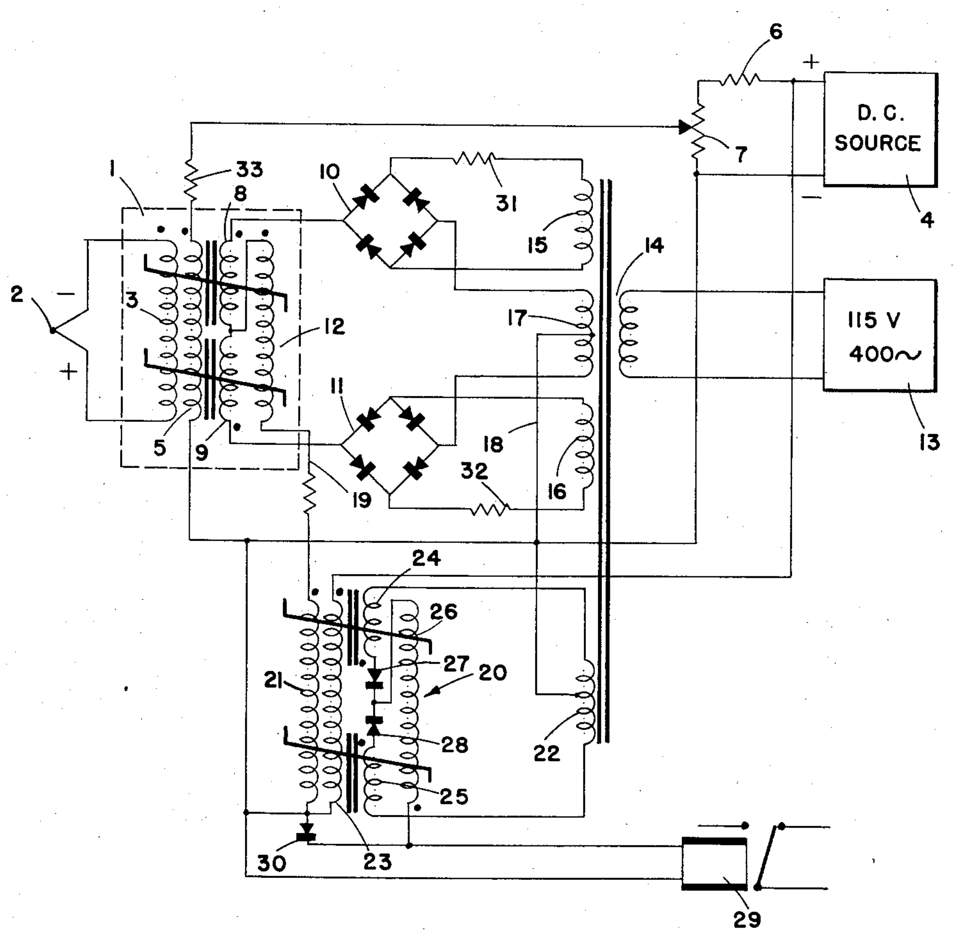
Fig. 1 is a schematic drawing of the device of this invention.

Fig. 1 is a schematic of the device receiving signals from a thermocouple. Saturable reactor 1 is connected to thermocouple 2 through control winding 3. Reactor 1 has two toroidal cores each composed of material which has a square hysteresis loop and which rapidly saturates. Such cores are made of oriented silicon steels, alloys of iron and nickel, or other cores variously termed "Supermalloy" or "Deltamax." In construction, load windings 8 and 9 are wound upon respective cores, with control winding 3, bias winding 5, and feedback winding

12 wound around both cores. A D.-C. source 4 provides bias voltage for control winding 5 of saturable reactor 1 through resistor 6 and potentiometer 7. Adjustment of potentiometer 7 determines the amount of output of reactor 1 when signals are received from thermocouple 2. Load winding 8 is connected at one end to diode bridge 10, and load winding 9 is connected at one end to diode bridge 11. The diodes are drawn pointing in the direction of conventional current flow. The common connection of windings 8 and 9 is connected to positive feedback winding 12 of saturable reactor 1 which provides for high gain. If sufficient positive feedback is used, the circuit operates as a trigger circuit when the output of thermocouple 2 reaches a given value.

A.-C. source 13 is connected to the primary of transformer coupling means consisting of transformer 14. A first secondary winding 15 is connected to opposing sides of diode bridge 10. A second secondary winding 16 is connected to opposing sides of diode bridge 11. A third secondary winding 17 is connected to corresponding ends of bridges 10 and 11, and provides the relative polarities in windings 3, 4, 8, 9, and 12 as indicated by the dots. That is, current flowing into the windings at the dots produces the same relative polarity in all windings. The diode bridges 10 and 11 are thus switched at the frequency of A.-C. source 13 by windings 15 and 16. In order that secondary windings 15 and 16 maintain control of the switching, their voltages should exceed the voltage developed across secondary winding 17. A typical example is one in which the voltage of windings 15 and 16 are 30 volts each, and winding 17, 12 volts. Winding 15 may be considered as connecting power winding 17 to reactor load winding 8 every other half cycle of power supply frequency. Likewise, winding 16 connects power winding 17 to reactor load winding 9 on alternate half cycles of power supply frequency. The load currents in windings 8 and 9 do not reverse and the control winding is only required to reset the core as distinguished in other cases from having to overcome the magnetomotive force of the output load currents. The combination of carrier switched diode bridges 10 and 11 and reactor 1 is, therefore, a self-saturating, full-wave magnetic amplifier. Because the magnetic amplifier output current is only a small fraction of the total current in the diode bridges, the dependence of the circuit on rectifier characteristics is minimized. Less drift and better balance in output is achieved. The polarity of bias winding 4, as indicated, resets the reactor in opposition to the voltage produced by thermocouple 2.

A further feature of switching diode bridges 10 and 11 at power supply frequency, as shown, is that a balanced output is obtained. The commencement and termination of flow of current through the diodes is divorced from the output voltages of the reactor and is dependent on the switching action of the A.-C. power source. This output is taken from the center tap of secondary winding 17 and feedback winding 12 by lines 18 and 19. Rectifier bridges operated as illustrated may be utilized in any conventional magnetic amplifier in place of the rectifiers. The signal level can be made sufficiently great by this method that no further amplification is necessary to drive a power, or driver, amplifier.

A typical driver magnetic amplifier 20 may be used comprising saturable cores similar to those of reactor 1, which is connected to receive the output through lines 18 and 19 which are connected to control winding 21 and to the center tap of the fourth secondary winding 22 of transformer 14. Bias winding 23 is connected to D.-C. source 4. Load windings 24 and 25 are connected to receive power from fourth secondary winding 22 and to feedback winding 26 through respective diodes 27 and 28. Again, relative polarities are indicated by the dots.

A relay 29 is energized by the output of driver magnetic amplifier 20. Relay 29, then, provides switching in accordance with the output of thermocouple 2. Diode 30 presents a low impedance path for relay back currents and prevents them from being reflected into the control winding 21. Resistors 31 and 32 prevent large currents from flowing in secondary windings 15 and 16. For keeping drift to a minimum, resistor 33 may be wound of special temperature sensitive wire such as alloys of various metals having suitable temperature coefficients of resistance. One example is an alloy of 70% nickel and 30% iron. This resistance is located near winding 3 to compensate for the variations in current in control winding 3 and thermocouple 2 termed "thermocouple cold junction drift." As the current in the control winding 3 decreases due to an increase in ambient temperature, the resistance of resistor 33 increases accordingly in compensation thereof.

Figure 2:
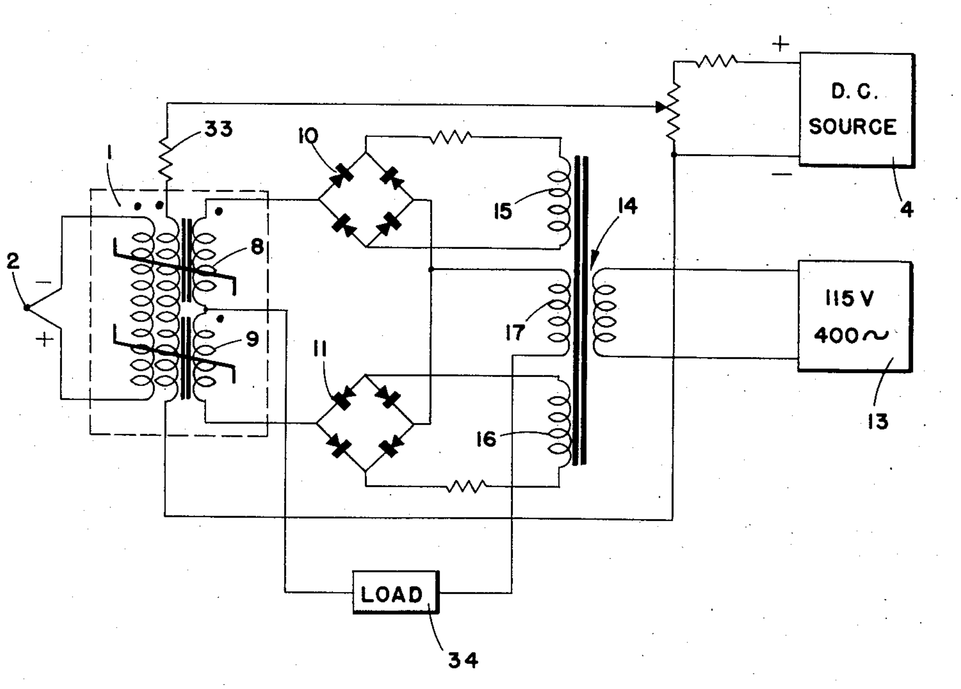
Fig. 2 is a schematic drawing of the device of this invention modified to provide A.-C. output.

Fig. 2 is a modified form of Fig. 1 in which an A.-C. output is obtained. The diode bridges 10 and 11 are switched in similar manner by secondary windings 15 and 16 of transformer 14. However, secondary winding 17 is connected at one end to both diode bridges 10 and 11 and at its other end to the load 34 which may be an amplifier illustrated by driver amplifier 20 in Fig. 1. As indicated in Fig. 2, the positive feedback winding may be eliminated. In such case, the circuit is an amplifier rather than a trigger circuit.

Although the invention has been described and illustrated in detail, it is to be clearly understood that the same is by way of illustration and example only and is not to be taken by way of limitation, the spirit and scope of this invention being limited only by the terms of the appended claims.

I claim:

1. A trigger circuit comprising a saturable reactor having at least one control winding, two load windings and a positive feedback winding, a low level signal device connected to said control winding, an A.-C. power source, a transformer having a plurality of secondary windings and whose primary winding is connected to said A.-C. power source, two diode bridges interconnecting respective load windings to opposing polarities of a first secondary of said transformer, said diode bridges connected respectively to the second and third secondary windings of said transformer for alternately causing blocking and passing of said current through said diode bridges, and a driver amplifier connected to a fourth secondary winding of said transformer and controlled by the carrier switched output of said diode bridges and said load windings.

2. In combination, a saturable reactor having a control winding, a bias winding, a positive feedback winding, and two load windings, a low level signal device connected to said control winding, an A.-C. power source, a transformer having a plurality of secondary windings and whose primary winding is connected to said A.-C. power source, diode bridges interconnecting respective load windings to opposing polarities of a first secondary of said transformer, the remaining terminals of said diode bridges connected respectively to the second and third secondary windings of said transformer for alternately causing blocking and passing of current from said power source through said diode bridges, and a driver amplifier including a control element connected to a fourth secondary winding of said transformer, the center tap of said fourth secondary transformer winding being connected to the center tap of said first secondary transformer winding, the control element of said driver amplifier connected to receive the output of said load windings through said positive feedback winding.

References Cited in the file of this patent

UNITED STATES PATENTS

| | | |
|---|---|---|
| 2,092,859 | Seaverson | Sept. 14, 1937 |
| 2,464,639 | Fitzgerald | Mar. 15, 1949 |

FOREIGN PATENTS

| | | |
|---|---|---|
| 226,104 | Switzerland | June 16, 1943 |
| 963,598 | France | Mar. 2, 1948 |
| 123,571 | Sweden | Dec. 14, 1948 |